United States Patent [19]

Bell

[11] 4,002,031
[45] Jan. 11, 1977

[54] SOLAR ENERGY CONVERTER WITH WASTE HEAT ENGINE

[75] Inventor: Ronald L. Bell, Woodside, Calif.

[73] Assignee: Varian Associates, Inc., Palo Alto, Calif.

[22] Filed: July 7, 1975

[21] Appl. No.: 593,913

[52] U.S. Cl. .............................. 60/641; 126/270; 126/271; 136/89 PC
[51] Int. Cl.² .................... F03G 7/02; H01L 31/06
[58] Field of Search ............ 136/89; 126/270, 271; 60/641; 62/2

[56] References Cited

UNITED STATES PATENTS

| | | | |
|---|---|---|---|
| 2,946,945 | 7/1960 | Regnier et al. | 136/89 X |
| 2,989,575 | 6/1961 | Wallace, Jr. | 136/89 |
| 3,675,026 | 6/1969 | Woodall | 250/211 J |
| 3,822,692 | 7/1974 | Demarest | 126/271 |
| 3,841,738 | 10/1974 | Caplan | 350/293 |

OTHER PUBLICATIONS

W. A. Beckman, et al., "Design Considerations for a 50–Watt Photovoltaic Power System Using Concentrated Solar Energy," *Solar Energy*, vol. 10, No. 3, pp. 132–136 (1966).
H. J. Hovel, et al., "$Ga_{1-x}Al_xAs$–GaAs P–P–N Heterojunction Solar Cells," *J. Electrochem. Soc.* vol. 120, No. 9, pp. 1246–1252 (1973).
R. Davis, et al., "Operation of GaAs Solar Cells at High Solar Flux Density," *Solar Energy*, vol. 17, p. 145 (1975).

*Primary Examiner* — F.C. Edmundson
*Assistant Examiner* — Aaron Weisstuch
*Attorney, Agent, or Firm* — Stanley Z. Cole; Richard B. Nelson; Robert K. Stoddard

[57] ABSTRACT

A solar energy converter uses gallium arsenide photovoltaic cells to convert light to direct current. Optical concentrators reduce the needed area of cells. Gallium arsenide retains high conversion efficiency up to several hundred degrees, so the waste heat may be used to produce mechanical power in a Rakine cycle engine.

5 Claims, 3 Drawing Figures

SOLAR ENERGY CONVERTER WITH WASTE HEAT ENGINE

FIELD OF THE INVENTION

This invention relates to the conversion of solar radiant energy to electrical and mechanical power.

Schemes for the direct utilization of solar energy have had limited utility but widespread inventive effort. With the impending inadequacy of fossil fuels, direct solar conversion can become economically feasible.

PRIOR ART

It has long ago been proposed to convert solar energy to heat, and use the heat to drive a conventional heat engine such as a steam turbine. The mechanical energy would then be converted to electrical energy. The efficiency of this process is necessarily low because the thermodynamic efficiency is limited by the available temperature difference.

More recently it has become possible to convert sunlight directy into electricity by photovoltaic cells or thermionic converters. The theoretical efficiency of this process can be fairly high but there are many practical limitations. Due to the cost of the cells it has been proposed to concentrate the light by collecting mirrors or lenses. The resulting high power density on previously used silicon cells makes heat removal a problem because the silicon cells lose efficiency rapidly as the temperature is raised.

SUMMARY OF THE INVENTION

According to the present invention, the overall efficiency of solar energy conversion is increased by using the waste heat from primary photovoltaic cells to drive a mechanical heat engine. The invention is made practical by the discovery that gallium arsenide photovoltaic cells retain good conversion efficiency at temperatures up to several hundred degrees centigrade. Thus a large area convergence of the concentrators is possible, and the resulting cell temperature is high enough to drive a heat engine with sufficient efficiency to improve the overall efficiency of the system.

DESCRIPTION OF THE PREFERRED EMBODIMENTS

Figure 1:
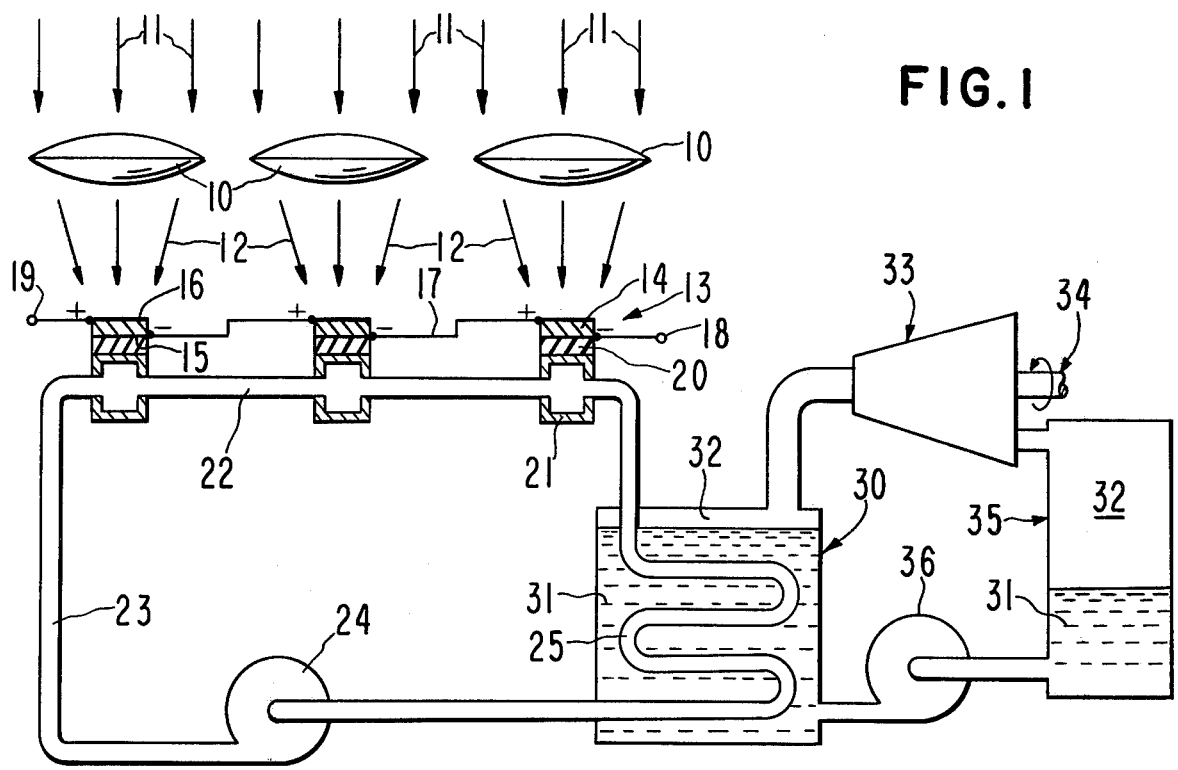
FIG. 1 is a diagrammatic illustration of an embodiment of the conversion system.

The conversion system sketched in FIG. 1 has a number of collectors 10 for concentrating the sun's electromagnetic radiation 11, including infrared, visible and near ultraviolet. Collectors 10 are shown as lenses, but could equally well be mirrors. They should ideally cover as much of the area of a collecting field as possible. Collectors 10 may be driven rotationally to follow the sun for maximum focal efficiency or they may be stationary, spherically or cylindrically focused collectors.

The concentrated radiation 12 falls on an array of photovoltaic receptors 13. Each receptor 13 comprises a junction cell 14 having negative and positive electrical contacts 15, 16 on opposing sides. The contacts of an array of cells are electrically connected in series by connecting wires 17 to negative and positive output terminals 18, 19. In this way the electromotive forces of the cells, of the order of one volt, are added to form a commercially useful dc voltage.

Each cell 13 is thermally bonded to a thermally conducting insulator 20, as of beryllia ceramic. Insulators 20 are in turn bonded to metallic heat exchangers 21. A cooling fluid 23 circulating through pipes 22 flows through heat exchangers 21, removing the portion of absorbed solar energy which is not converted to electricity, typically 80 to 85%. If cooling fluid 23 is a good insulator, such as gaseous helium or a silicone liquid, insulators 20 will not be needed, but corresponding insulation in the connecting pipes would be required. Cooling fluid 23 may be water or a liquid metal. It also may be a vaporizable working fluid for the heat engine, the vaporization taking place directly in heat exchangers 21. For maximum thermal efficiency exchangers 21 may be piped in parallel instead of the series piping 22 shown.

In the embodiment shown in FIG. 1 the hot coolant 23 is circulated by a pump 24 through the input coil 25 of a heat exchanger-boiler 30. The output side of boiler 30 contains a vaporizable liquid 31 which serves as the working fluid of the heat engine. Its vapor 32 passes through a steam turbine 33 to drive an output shaft 34 from which useful mechanical energy is extracted. The expanded and cooled vapor 32 enters a condenser 35 whence condensed liquid 31 is fed back to boiler 30 by a feed pump 36.

Figure 2:
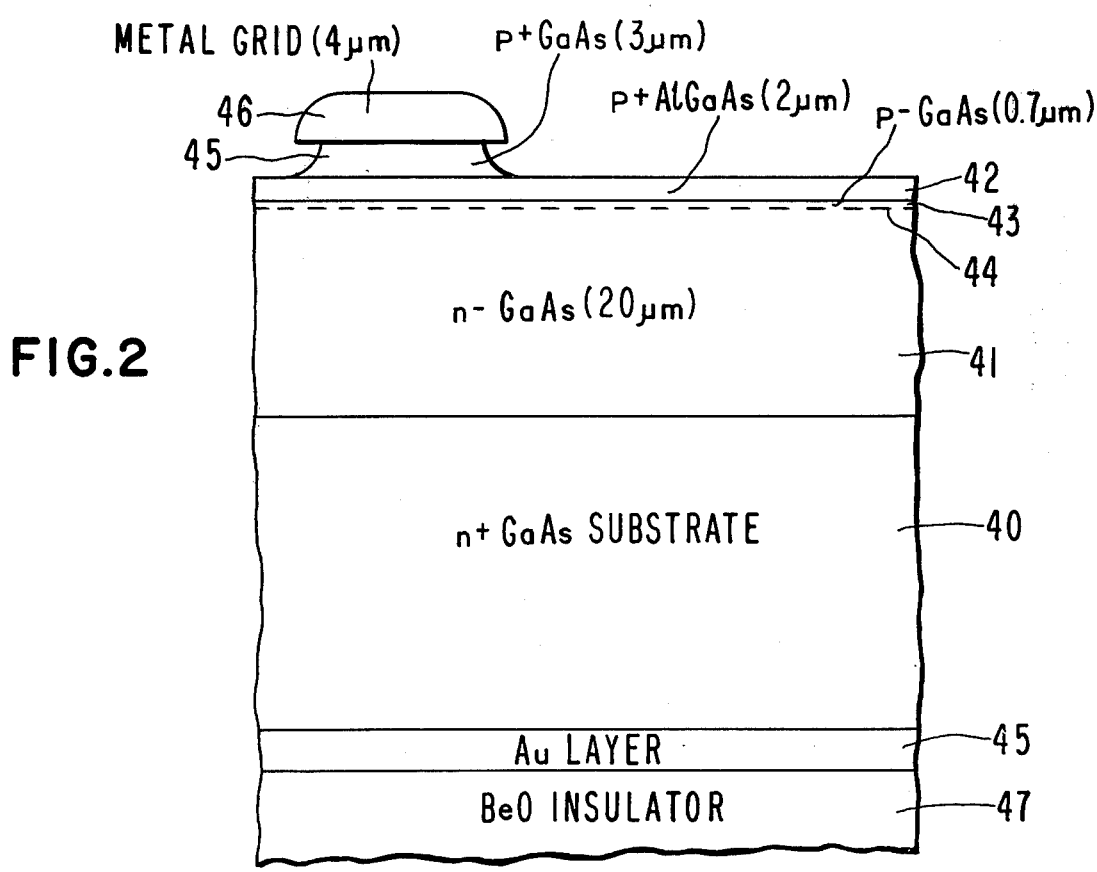
FIG. 2 is a schematic cross section of a gallium arsenide photovoltaic cell.

FIG. 2 shows schematically the construction of a gallium arsenide photovoltaic cell suitable for operation in the conversion system. It consists of a single-crystal GaAs substrate 40 doped $n+$ with $10^{18}$ atoms of tin per cubic centimeter. On the substrate 40 is grown a 20 micron epitaxial layer 41 of Sn-doped n-type GaAs to reduce defect densities. On GaAs layer 41 is grown a 2 micron epitaxial layer 42 of AlGaAs doped $p+$ type with $3 \times 10^{18}$ atoms per cubic centimeter of magnesium. During this growth, Mg diffuses into the GaAs, forming a very thin layer 43 of p-type GaAs and a p-n junction 44 at a depth of 0.5 to 0.8 microns in the GaAs.

The AlGaAs 42 acts as a transparent ohmic contact to the thin p-GaAs layer 43, which is the most critical component of the cell. At the same time the bandstructure discontinuity between GaAs and AlGaAs acts to prevent recombination of photogenerated electrons at the free surface, and to turn them back towards the junction. Both these functions are absent in prior-art silicon cells.

In order to apply ohmic contacts to the AlGaAs without obstructing much of the light incident on its surface, an apertured mesh structure is applied to its upper surface by well-known photoetching techniques. The contacts comprise a 3 micron growth of p-type Mg-doped GaAs 45 in order to promote good ohmic contact with a subsequently applied metal electrode 46, which may be a honeycomb shaped grid of deposited metal such as gold 4 microns thick. Around the periphery of the cell the grid 46 is attached to connecting wires 17 (FIG. 1). On the bottom of substrate 40 the second ohmic contact 47 is deposited as a continuous metallic layer for attachment to the other connecting wire 17.

Figure 3:
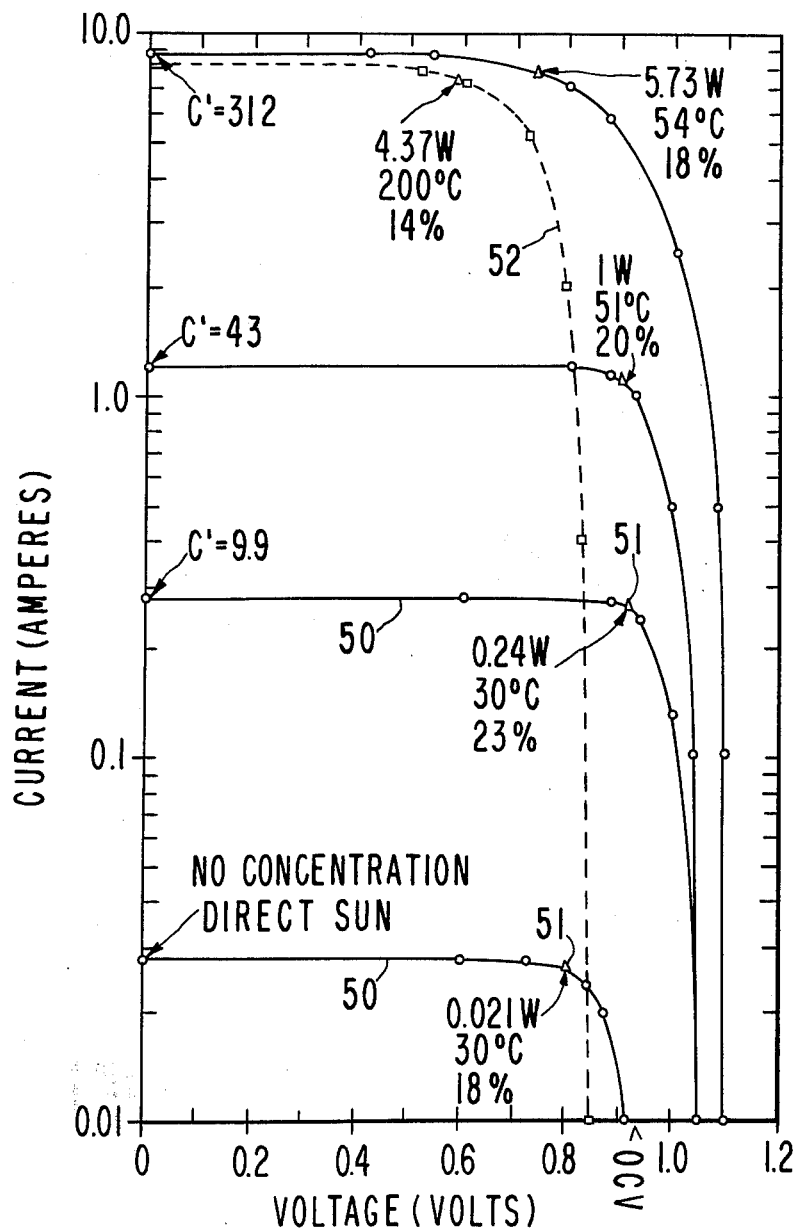
FIG. 3 is a graph of the current-voltage characteristics of the cell of FIG. 2.

FIG. 3 shows the performance of a GaAs photovoltaic cell as described above, ½ inch in diameter. The individual curves 50 are the current-vs-voltage characteristics, each taken with a different degree of area concentration C' of direct sunlight. For each curve 50, the point of maximum power output (i.e., maximum efficiency) 51 is marked, and the power output, cell temperature and conversion efficiency (with a convective heat sink) are indicated.

Curve 52 is the performance when the cell temperature was allowed to rise to 200° C. The conversion efficiency fell only from 18% to 14%. The loss in power output would be more than made up by a reasonably efficient heat engine operating at a 200° C maximum temperature, such as a Rankine cycle engine with a vaporizable working fluid. Saturated steam pressure at 200° C is 200 pounds per square inch, adequate for turbine operation. The overall system efficiency would thus be improved. Also, there are indications that the GaAs cells may operate reliably as high at 300° C, corresponding to a saturated steam pressure of 1246 pounds per square inch.

The above are specific examples of a system for converting solar energy directly to electricity and indirectly to mechanical energy. Many variations of the inventive system will be obvious to those skilled in the art. The preferred embodiments described above are thus to be interpreted as illustrative and not limiting.

What is claimed is:
1. A solar energy converter comprising:
    collector means for concentrating solar electromagnetic radiation,
    a gallium arsenide junction cell for receiving said concentrated radiation and converting a portion thereof to electrical energy,
    means for transferring heat from said cell to a circulating fluid, and
    heat engine means for converting a portion of said heat to mechanical energy.
2. The apparatus of claim 1 wherein said gallium arsenide cell comprises a layer of gallium aluminum arsenide as a transparent contact.
3. The apparatus of claim 2 wherein said layer of gallium aluminum arsenide is an epitaxial layer on the side of said cell receiving said concentrated radiation.
4. The apparatus of claim 1 wherein said cell includes an apertured, metallically conductive contact layer on the side of said cell receiving said concentrated radiation.
5. The apparatus of claim 4 wherein said contact layer overlays a layer of expitaxial gallium aluminum arsenide.

* * * * *